(12) United States Patent
Kwon et al.

(10) Patent No.: US 9,406,705 B2
(45) Date of Patent: Aug. 2, 2016

(54) DISPLAY BACKPLANE HAVING MULTIPLE TYPES OF THIN-FILM-TRANSISTORS

(71) Applicant: LG Display Co., Ltd., Seoul (KR)

(72) Inventors: Hoiyong Kwon, Busan (KR); DongYoon Kim, Paju-si (KR); Hyoung-Su Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/588,193

(22) Filed: Dec. 31, 2014

(65) Prior Publication Data

US 2015/0243719 A1    Aug. 27, 2015

Related U.S. Application Data

(60) Provisional application No. 61/944,464, filed on Feb. 25, 2014, provisional application No. 61/944,469, filed on Feb. 25, 2014.

(30) Foreign Application Priority Data

Dec. 31, 2014    (KR) .................. 10-2014-0195119
Dec. 31, 2014    (KR) .................. 10-2014-0195302

(51) Int. Cl.
*H01L 27/32*    (2006.01)
*H01L 29/786*    (2006.01)
*H01L 27/12*    (2006.01)

(52) U.S. Cl.
CPC ........ *H01L 27/1248* (2013.01); *H01L 27/1222* (2013.01); *H01L 27/1225* (2013.01); *H01L 27/1251* (2013.01); *H01L 27/3276* (2013.01)

(58) Field of Classification Search
CPC ............ H01L 27/3262; H01L 27/1428; H01L 27/1251; H01L 27/3258; H01L 27/3276; H01L 29/78675; H01L 29/7869
See application file for complete search history.

(56) References Cited

U.S. PATENT DOCUMENTS

| | | | |
|---|---|---|---|
| 2003/0089949 A1 | 5/2003 | Lin et al. | |
| 2008/0020519 A1 | 1/2008 | Cheng et al. | |
| 2009/0061571 A1 | 3/2009 | Li | |
| 2011/0049523 A1* | 3/2011 | Choi | H01L 27/1225 257/72 |
| 2011/0109532 A1* | 5/2011 | Choi | H01L 27/3269 345/76 |
| 2011/0175097 A1 | 7/2011 | Song et al. | |
| 2013/0162617 A1 | 6/2013 | Yoon et al. | |
| 2014/0078127 A1 | 3/2014 | Lin et al. | |
| 2014/0094002 A1* | 4/2014 | Ma | H01L 21/2652 438/151 |
| 2014/0131703 A1 | 5/2014 | Miyamoto et al. | |
| 2014/0159038 A1 | 6/2014 | Im | |
| 2014/0299842 A1 | 10/2014 | Kim et al. | |

OTHER PUBLICATIONS

PCT International Search Report for PCT/KR2015/013796, Mar. 30, 2016, 3 Pages.

\* cited by examiner

*Primary Examiner* — Whitney T Moore
(74) *Attorney, Agent, or Firm* — Fenwick & West LLP

(57) ABSTRACT

There is provided a TFT backplane having at least one TFT with oxide active layer and at least one TFT with poly-silicon active layer. In the embodiments of the present disclosure, at least one of the TFTs implementing the circuit of pixels in the active area is an oxide TFT (i.e., TFT with oxide semiconductor) while at least one of the TFTs implementing the driving circuit next to the active area is a LTPS TFT (i.e., TFT with poly-Si semiconductor).

17 Claims, 15 Drawing Sheets

DISPLAY BACKPLANE HAVING MULTIPLE TYPES OF THIN-FILM-TRANSISTORS

CROSS-REFERENCE TO RELATED APPLICATIONS

This application claims priority under 35 U.S.C. §119(a) to Korean Patent Application No. 10-2014-0195119 filed on Dec. 31, 2014, and Korean Patent Application No. 10-2014-0195302 filed on Dec. 31, 2014; and also claims priority under 35 U.S.C. §119(e) to U.S. provisional patent application No. 61/944,464 filed on Feb. 25, 2014 and U.S. provisional patent application No. 61/944,469 filed on Feb. 25, 2014, which are hereby incorporated by reference in their entirety.

BACKGROUND

1. Technical Field

The present disclosure generally relates to a display device, and more particularly, to an array of thin-film-transistor (TFT) of a display device.

2. Description of the Related Art

Flat panel display (FPD) are employed in various electronic devices such as mobile phones, tablets, notebook computers as well as televisions and monitors. Examples of the FPD includes a liquid crystal display (LCD), a plasma display panel (PDP), an organic light emitting diode (OLED) display as well as an electrophoretic display (EPD). Pixels of the FPDs are arranged in a matrix form and controlled by an array of pixel circuits. Some of the driving circuits, which provides signals for controlling the array of pixel circuits, are implemented with thin-film-transistors (TFTs) on the same substrate as the array of pixel circuits. The substrate, where the pixel circuits and the driving circuits are formed on, is referred to as a TFT backplane.

The TFT backplane is an important part of a FPD as it functions as a series of switches to control the current flowing to each individual pixel. Until recently, there have been two primary TFT backplane technologies, one using TFTs with amorphous silicon (a-Si) active layer and the other using TFTs with polycrystalline silicon (poly-Si) active layer. Generally, fabricating a TFT backplane by using the amorphous silicon TFTs is cheaper and easier than making a TFT backplane with other types of TFTs. However, a-Si TFT has low carrier mobility, and thus making a high speed backplane for a display is difficult with a-Si TFTs.

To improve the mobility of the a-Si TFTs, a-Si can be subjected to a heat-treatment using a laser beam that anneals the Si layer to form polycrystalline silicon active layer. The material from this process is generally referred to as low-temperature poly-Si, or LTPS. The carrier mobility of LTPS TFTs is higher than the a-Si TFTs by as much as 100 times (>100 cm$^2$/V·s). Even at a small profile, the LTPS TFT offers excellent carrier mobility, and thus it may be the ideal choice for fabricating a fast speed circuits in a limited space. Despite the aforementioned advantages, however, initial threshold voltages may vary among the LTPS TFTs in a backplane due to the grain boundary of the poly-crystalized silicon semiconductor layer.

Due to the polycrystalline nature of its active layer, however, LTPS TFTs tend to have larger variations in threshold voltage (Vth) among the TFTs in a backplane, which can lead to display non-uniformity referred to as "mura." For this reason, a display drive circuit implemented with LTPS TFTs often requires an additional compensation circuit, which in turn, increases the manufacturing time and cost of the display.

A TFT employing an oxide material based semiconductor layer, such as an indium-gallium-zinc-oxide (IGZO) semiconductor layer (referred hereinafter as "the oxide TFT"), is different from the LTPS TFT in many respects. Oxide TFTs offer a higher carrier mobility than the a-Si TFTs at a lower manufacturing cost than the LTPS TFTs. Also, relatively low initial threshold voltage variations than the LTPS TFTs provide scalability to any glass size. Despite a lower mobility than the LTPS TFT, the oxide TFT is generally more advantageous than the LTPS TFT in terms of power efficiency. In addition, low leakage current of the oxide TFTs during the off state allows can be of a great advantage for designing a power efficient circuits. For instance, circuits can be designed to operate the pixels at a reduced frame rate when a high frame rate driving of the pixels is not needed.

However, stable high-yield production of oxide TFT based backplane requires optimization of the TFT design, dielectric and passivation materials, oxide film deposition uniformity, annealing conditions, and more. Solving one issue often means trading-off performance of another, and the degree of integration in a backplane of a display may become even lower than that of amorphous silicon or poly-silicon.

Accordingly, the maximum performance of a display cannot be obtained with a TFT backplane that is implemented with the same type of TFTs. Moreover, display itself can have various requirements, such as visual quality (e.g., luminance, uniformity), power efficiency, higher pixel density, reduction of bezel, and more. Meeting more than one of such requirements can be a difficult task with a TFT backplane implemented with a single type of TFTs.

BRIEF SUMMARY

In view of the problems above, inventors of the embodiments in the present disclosure recognized that there is a limit in providing displays with a higher resolution at a lower power consumption with conventional TFT backplane employing a single type of TFTs. Ever expanding applications of FPDs in devices for versatile pixel driving methods adds further to the needs for providing a TFT backplane that combines advantages of oxide transistors with that of poly-silicon transistors.

According to an aspect of the invention, there is provided with a TFT backplane having at least one TFT with oxide active layer and at least one TFT with poly-silicon active layer.

In the embodiments of the present disclosure, at least one of the TFTs implementing the circuit of pixels in the display area is an oxide TFT (i.e., TFT with oxide semiconductor) while at least one of the TFTs implementing the driving circuit next to the display area is a LTPS TFT (i.e., TFT with poly-Si semiconductor). In one embodiment, a drive transistor connected to an organic light emitting diode and an emission transistor are realized by using an LTPS transistor where an active layer is made out of a poly-silicon semiconductor. In one embodiment, switching transistor is implemented with oxide.

It should be noted that the embodiments described in the present disclosure are not intended to be bound or otherwise be limited by any express or implied theory presented in the preceding background and brief summary. It should also be appreciated that the following detailed description is merely exemplary in nature and is not intended to limit the embodiments or the application and uses thereof. Hereinafter, exemplary embodiments will be described in detail with reference to the accompanying drawings.

DETAILED DESCRIPTION

Various features and advantages described in the present disclosure will be more clearly understood from the following description with reference to the accompanying drawings. Note that the accompanying drawings are merely illustrative and may not be drawn to scale for easier explanation. Also, components having the same or similar function may be denoted by the same reference symbols/numeral throughout the drawings for describing various embodiments. The descriptions of the same or similar components may be omitted.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or inter-vening elements may be present. In contrast, when an element is referred to as being "directly connected" or "directly coupled" to another element, there are no intervening elements present. Further, it will be understood that when an element is referred to as being "overlapped" with another element, at least some portion of one element can be positioned above or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or together executed through an association relationship. Hereinafter, various embodiments of the present invention will be described in detail with reference to the accompanying drawings.

Figure 1:
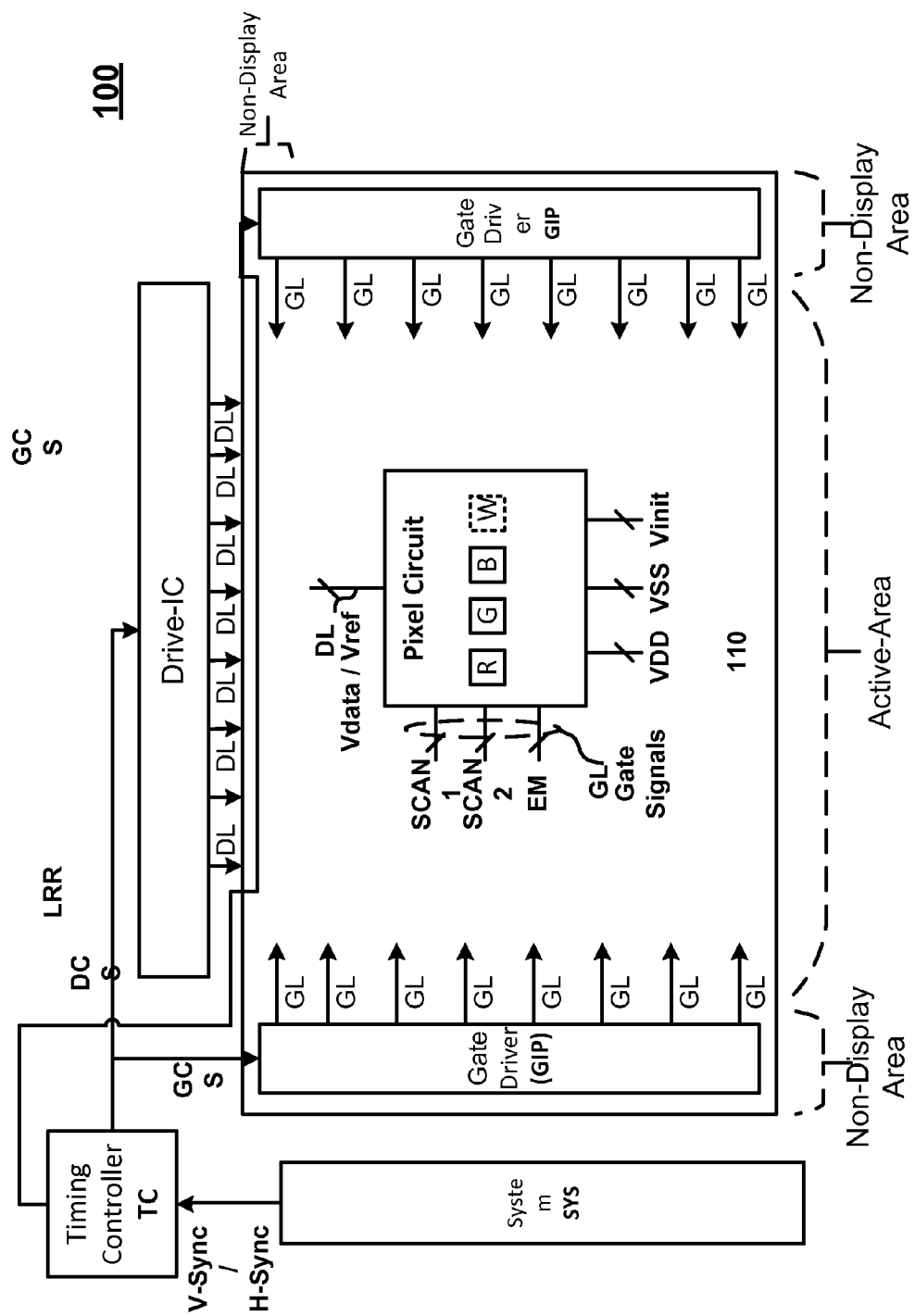
FIG. 1 illustrates an exemplary display which may be incorporated in electronic devices.

FIG. 1 illustrates an exemplary display which may be incorporated in electronic devices. The display device 100 includes at least one display area, in which an array of display pixels is formed therein. One or more non-display areas may be provided at the periphery of the display area. That is, the non-display area may be adjacent to one or more sides of the display area.

In FIG. 1, the non-display area surrounds a rectangular shape display area. However, it should be appreciated that the shapes of the display area and the arrangement of the non-display area adjacent to the display area are not particularly limited as the exemplary display 100 shown in FIG. 1. The display area and the non-display area may be in any shape suitable to the design of the electronic device employing the display 100. Non-limiting examples of the display area shapes of the display 100 include a pentagonal shape, a hexagonal shape, a circular shape, an oval shape, and more.

Displays employed in various devices may, in general, include display pixels formed from light-emitting diodes (LEDs), organic light-emitting diodes (OLEDs), plasma cells, electrowetting pixels, electrophoretic pixels, liquid crystal display (LCD) components, or other suitable image pixel structures. In some situations, it may be desirable to use OLEDs to form the display 100, so configurations for display 100 are sometimes described using OLED display in the present disclosure. However, it should be noted that the present invention can be used in other types of display technologies, such as the displays with liquid crystal elements and backlight structures.

Each pixel in the display area may be associated with a pixel circuit, which includes one or more thin-film transistors (TFTs) fabricated on the backplane of the display 100. Each pixel circuit may be electrically connected to a gate line and a data line to communicate with one or more driving circuits, such as a gate driver and a data driver positioned in the in non-display area of the display 100.

One or more driving circuits may be implemented with TFTs fabricated in the non-display area as depicted in FIG. 1. For instance, a gate driver may be implemented with a plurality of TFTs on the substrate of the display 100. Such a gate driver may be referred to as a gate-in-panel (GIP). Various additional circuits for generating a variety of signals for operating the pixels or for controlling other components of the display 100 may be implemented with TFTs fabricated on the substrate. Non limiting examples of the circuits that can be implemented with TFTs of the backplane include an inverter circuit, a multiplexer, an electro static discharge (ESD) circuit and the like. The substrate, in which the array of TFT is implemented on, may be a glass substrate or a polymer substrate. The substrate may be a flexible substrate in case where the display is a flexible display.

Some driving circuits can be provided as an integrated circuit (IC) chip, and mounted in the non-display area of the display 100 using a chip-on-glass (COG) or other similar method. Also, some driving circuits can be mounted on another substrate and coupled to a connection interface (Pads/Bumps, Pins) disposed in the non-display area using a printed circuit such as flexible printed circuit board (PCB), chip-on-film (COF), tape-carrier-package (TCP) or any other suitable technologies.

In the embodiments of the present disclosure, at least two different type of TFTs are used in the TFT backplane for displays. The type of TFTs employed in the part of the pixel circuit and the part of the driving circuit can vary according to the requirements of the display.

For example, the pixel circuit may be implemented with TFTs having oxide active layer while the driving circuit is implemented with TFTs having poly-Si active layer (LTPS TFT). Unlike LTPS TFTs, oxide TFTs do not suffer from the pixel-to-pixel threshold voltage ($V_{th}$) variation issue that arises from the formation over the large area. Accordingly, uniform $V_{th}$ for the driving TFT and/or the switching TFT can be obtained in the array of pixel circuits even for a large sized display. The Vth uniformity issue among the TFTs implementing the driving circuit is less likely to have a direct affect in the luminance uniformity of the pixels. For driving circuits (e.g., GIP), desired factors may include capability for providing scan signals at higher speed and/or the size of the driving circuit for reducing the size of the bezel.

With the driving circuits on the backplane being implemented with LTPS TFTs, signals and data to the pixels can be provided at a higher clock than the case where entire TFTs in the TFT backplane is formed of oxide TFTs. Accordingly, a large sized display capable of high speed operation can be provided without the mura. In other words, advantages of oxide TFT and LTPS TFT are combined in the design of the TFT backplane.

Using oxide TFTs for the pixel circuit and using LTPS TFTs for the driving circuit can be advantageous in terms of power efficiency of the display as well. Conventional displays operate at a fixed refresh rate (e.g., 60 Hz, 120 Hz, 240 Hz, etc.). However, for some image content (e.g., still image), a display needs not be operated at such a high refresh rate. In some cases, a portion of the display needs to operate at a high refresh rate while another portion of the display can operate at a low refresh rate. For instance, a part of the active area displaying a still image data (e.g., user interface, text) may be refreshed at a lower rate than other part of the active area displaying rapidly changing image data (e.g., movie). As such, the display 100 may be provided with a feature in which the pixels of the entire active area or selective portion of the active area are driven at a reduced frame rate under a specific condition. In other words, the refresh rate of the display is adjusted according to the image content.

Reducing the duration of pixels driven at unnecessarily high frequency would minimize the power wasted from providing the pixels with the same image data. The pixels driven at a reduced refresh rate may have an increased blank period, in which the data signal is not provided to the pixels. The pixel circuit implemented with oxide TFTs is well suited for the low frequency operation described above as the oxide TFT has very low leakage current during its off state in comparison to LTPS TFT. By reducing the current leakage from the pixel circuits during the lengthened blank period, the pixels can achieve more stable level of luminance even when the display is refreshed at a reduced rate.

Efficient use of the real-estate in the substrate is yet another benefit offered by the TFT backplane using oxide TFT based pixel circuit and LTPS TFT based driving circuit. The low currant leakage characteristic of the oxide TFT enables to reduce the size of capacitor in each of the pixels. The reduction of the capacitor size provides more room for additional pixels within the active area of the substrate to provide high-resolution display without increasing the substrate size. Although the size of individual oxide TFT may be larger than the size of an LTPS TFT, a compensation circuit can be eliminated by implementing the pixel circuit with oxide TFTs, thereby reducing the overall size of the pixel circuit. Further, relatively smaller size of the LTPS TFT makes it easy to implement condensed driving circuits at the areas peripheral to the active area, enabling reduced bezel size for the display.

In some embodiments, even more elaborate optimization of the display is achieved by implementing a pixel circuit for each of the pixels and/or a driving circuit with multiple types of TFTs. That is, individual TFT in the pixel circuit and/or the driving circuit is selected according to its functionality, operating condition and requirement within the pixel circuit.

At the basic level, each of the pixels can be configured in with a switching transistor, a drive transistor, a capacitor and an OLED. Additional transistors may be employed to implement higher performance pixel circuit.

Figure 2A:
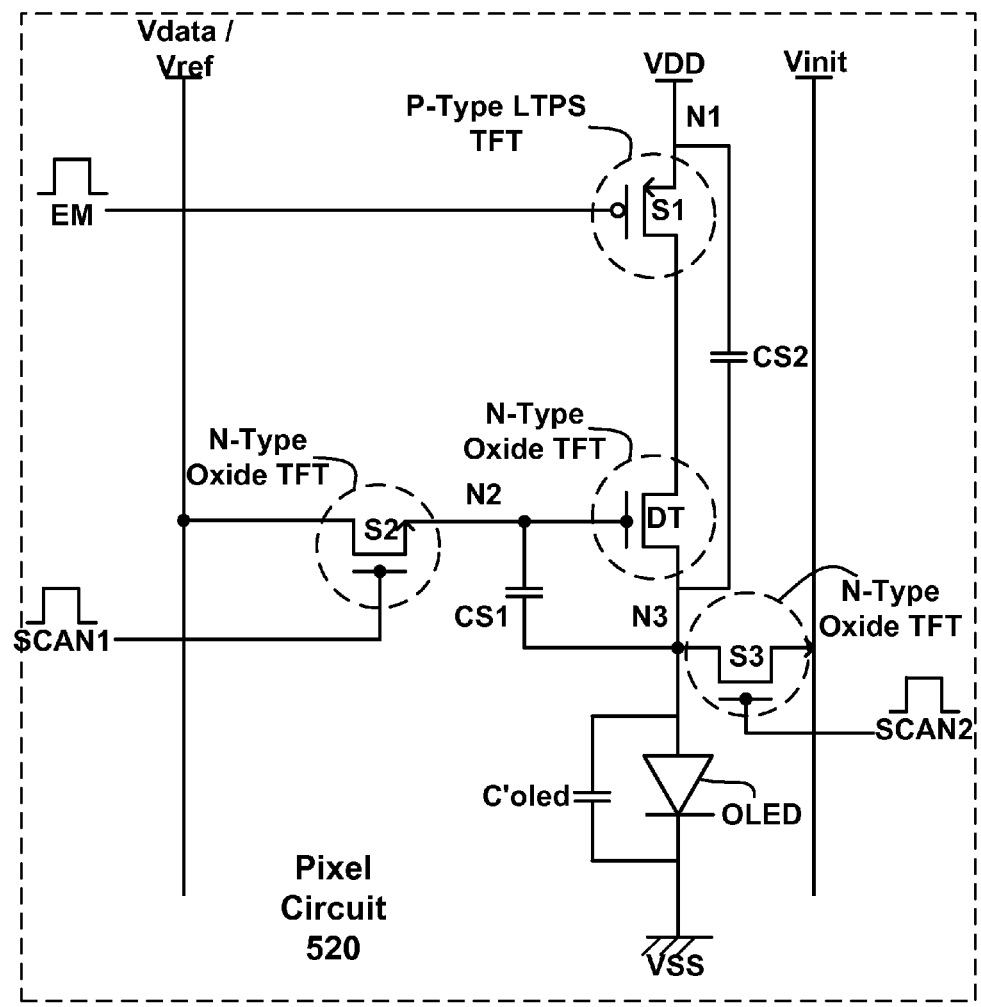
FIG. 2A illustrates one suitable pixel circuit that can be used in the embodiments of the present disclosure.

FIG. 2A illustrates one suitable pixel circuit that can be used in the embodiments of the present disclosure.

The first switching transistor (S1) includes a gate electrode connected to an emission signal line (EM). The first switching transistor (S1) has a source electrode connected to the first node (N1) and a drain electrode connected to a source electrode of a driving transistor (DT). One end of the first node (N1) is connected to a power voltage signal line (VDD). The driving transistor (DT) has a gate electrode connected to a second node (N2) and a drain electrode connected to a third node (N3).

The pixel circuit also includes a second switching transistor (S2), which has a source electrode connected to the data line (VDATA) to receive the data signal and a drain electrode connected to the second node (N2). The gate electrode of the second switching transistor (S2) is connected to the scan line (SCAN1) to turn on/off the second switching transistor (S2) according to the scan signal from the driving circuit at the periphery of the active area.

Also included in the pixel circuit is a third switching transistor (S3) having a gate electrode connected to a second scan signal line (SCAN2). The third switching transistor (S3) has a source electrode connected to a third node (N3) and a drain electrode to an initial signal line (VINI). The anode of the OLED is connected to the third node (N3) and the cathode of the OLED is connected to the second power voltage line (VSS).

The first capacitor (CS1) includes one end connected to the second node (N2) and the other end connected to the third node (N3). The second capacitor (CS2) includes one end connected to the first node (N1) and another end connected to the third node (N3).

Figure 2B:
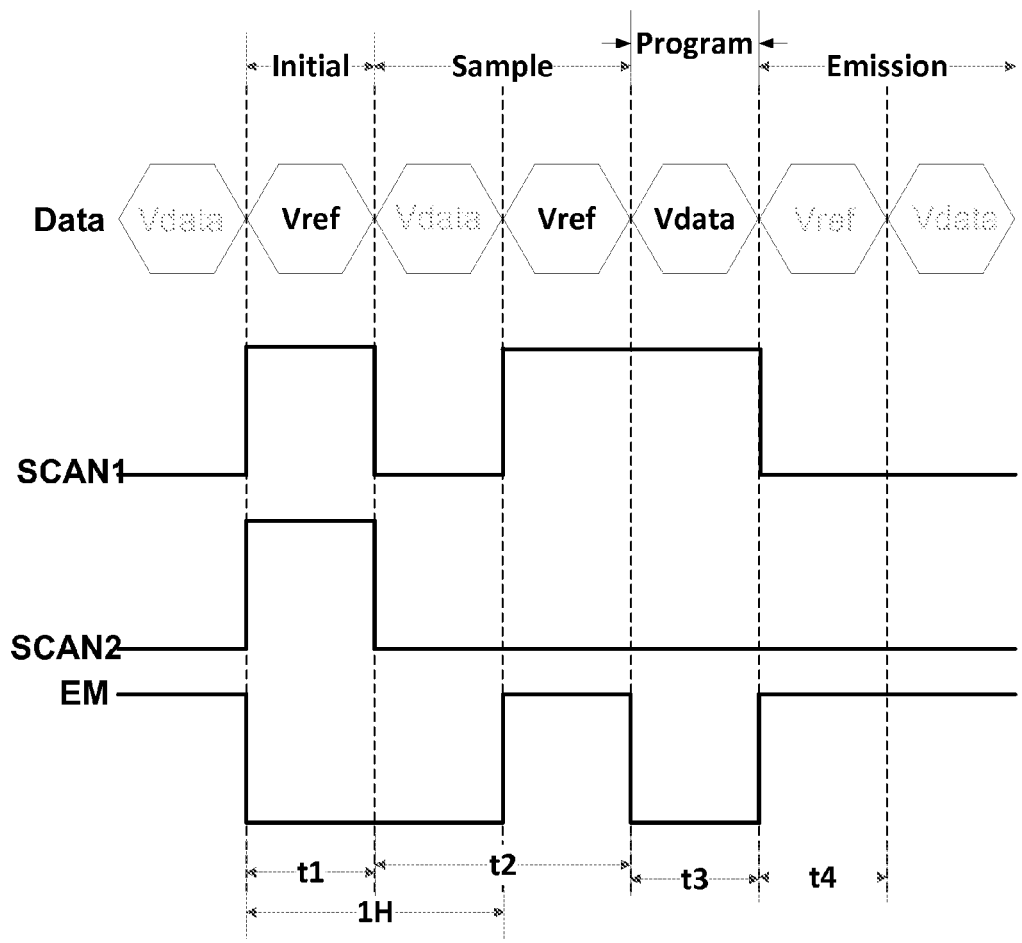
FIG. 2B illustrates a timing diagram of an exemplary 4T2C pixel circuit shown in FIG. 2A.

FIG. 2B illustrates a timing diagram of an exemplary 4T2C pixel circuit shown in FIG. 2A. The timing of the TFTs in the pixel circuit depicted in FIG. 2B is based on the operation of the pixel circuit implemented with N-TYPE oxide TFTs.

While all of the TFTs on the substrate operate jointly to control the emission of light from the OLED element, each of the TFTs in the pixel circuit serves a different function during the operation. As such, operating conditions and requirements of the TFTs can vary even among the TFTs forming the pixel circuit.

As can be seen from the diagram, the reference voltage and the data voltage are alternately applied on the data line during driving of the pixel. Applying the scan signal on the Scan1 and the EM signal for 1 H makes it convenient to maintain the initial and sampling timing. However, a permanent shift in the $V_{th}$ may occur from the stress caused by continuous flow of current for extended period of time, which is called positive bias stress. Such a problem is more prevalent in oxide TFTs than the LTPS TFTs. In the operation of the 4T2C pixel circuit described above, the TFT serving as the emission transistor is in "On" state for much longer than other TFTs. With the current flowing over almost the entire frame, the emission transistor formed of oxide TFT may cause various undesired problems in the display.

As such, in one embodiment, the emission transistor of the pixel circuit is formed of a P-TYPE LTPS TFT while N-TYPE oxide TFTs are used for the rest of the pixel circuit. With the emission transistor of the pixel circuit formed of a P-TYPE LTPS TFT, the exemplary 4T2C pixel circuit may operate as the timing diagram shown in FIG. 2C. Under this operating scheme, problems associated with PBTS in the emission transistor of the pixel circuit can be suppressed.

Similar configuration can be used for any other TFTs of the pixel circuit and/or the driving circuit on the backplane. That is, other TFTs in the pixel circuit, which are subjected to more PBTS compared to other TFTs of the pixel circuit may be formed of a P-TYPE LTPS TFT. Accordingly, certain transistors of a pixel circuit configured to receive current for longer period of time can be formed with P-Type LTPS TFTs, which may be stronger against the positive bias stress.

Various other configurations of LTPS TFT and oxide TFT combination can be used in a pixel circuit. In some embodiments, the TFTs that are connected to a storage capacitor or to a node connected to a storage capacitor, may be formed of the oxide TFT to minimize leakage therefrom. Also, when employing both kinds of TFTs in the pixel circuit and/or the driving circuit, the LTPS TFT can be strategically placed within the circuit to remove bias remaining in a node between oxide TFTs during their off state and minimize the bias stress (e.g., PBTS, NBTS).

Figure 2C:
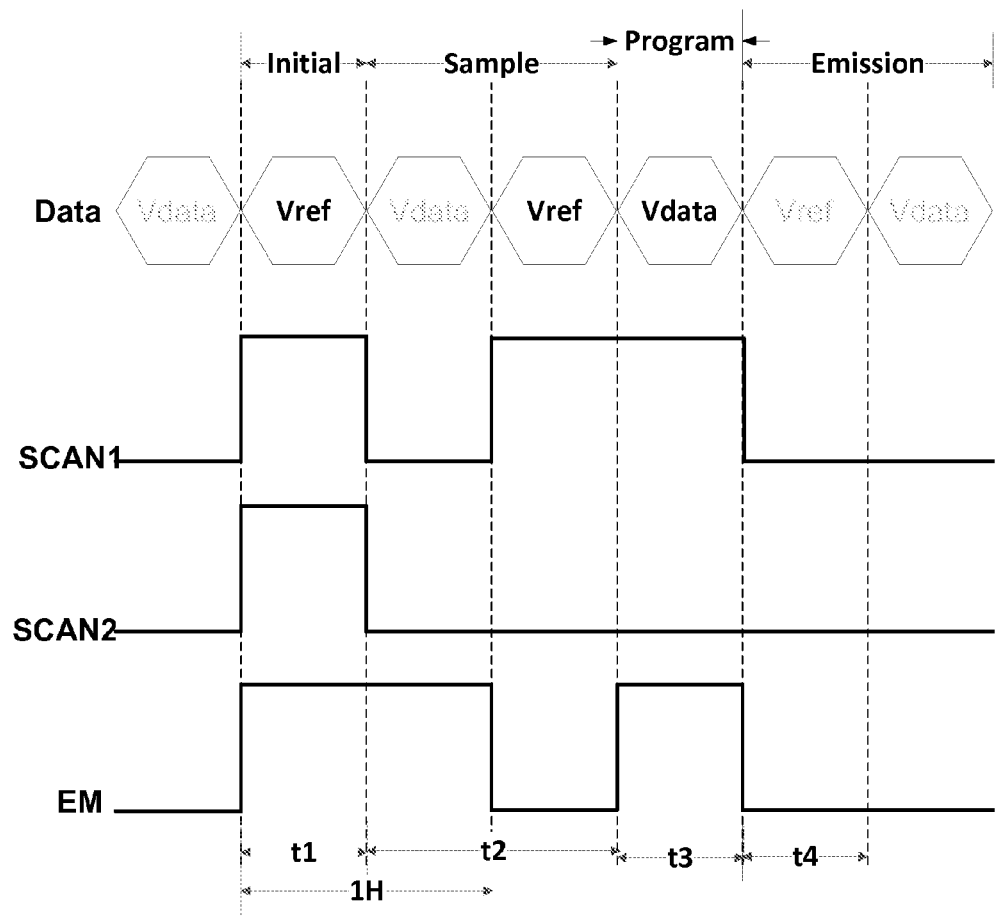
FIG. 2C illustrates a timing diagram of an exemplary 4T2C pixel circuit shown in FIG. 2A provided with multiple types of TFTS.

It should be noted that the configurations of the oxide TFT and the LTPS TFT combination in the pixel circuit described in reference to FIGS. 2A-2C are merely illustrative. As such, the use of oxide TFT and LTPS TFT combination within a pixel circuit may be applied in various pixel circuit designs other than the 4T2C pixel circuit designs shown above.

Figure 3A:
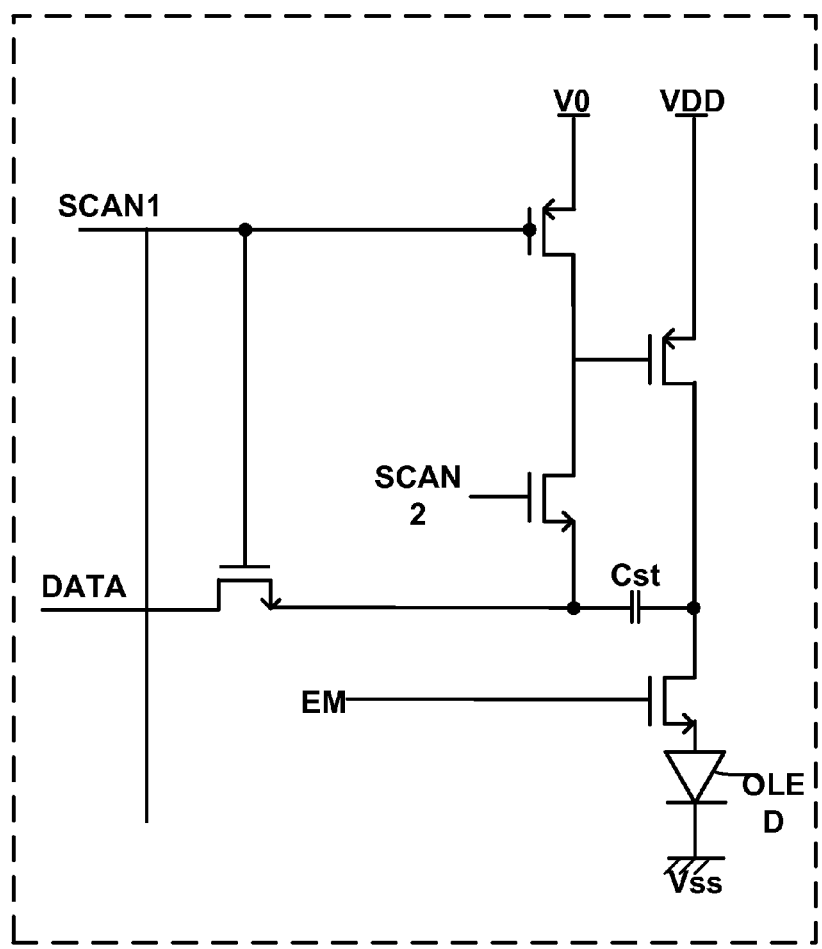
FIG. 3A illustrates an exemplary 5T1C pixel circuit implemented with N-Type oxide TFTs and the timing diagram describing the operation of the pixel circuit.
Figure 3A:
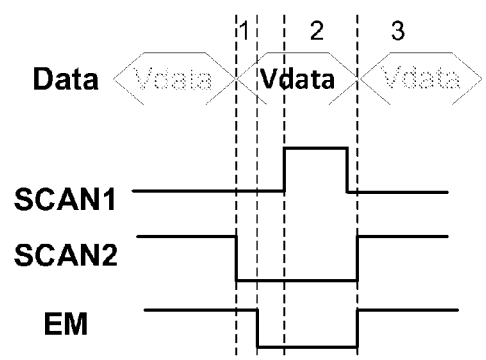
Figure 3B:
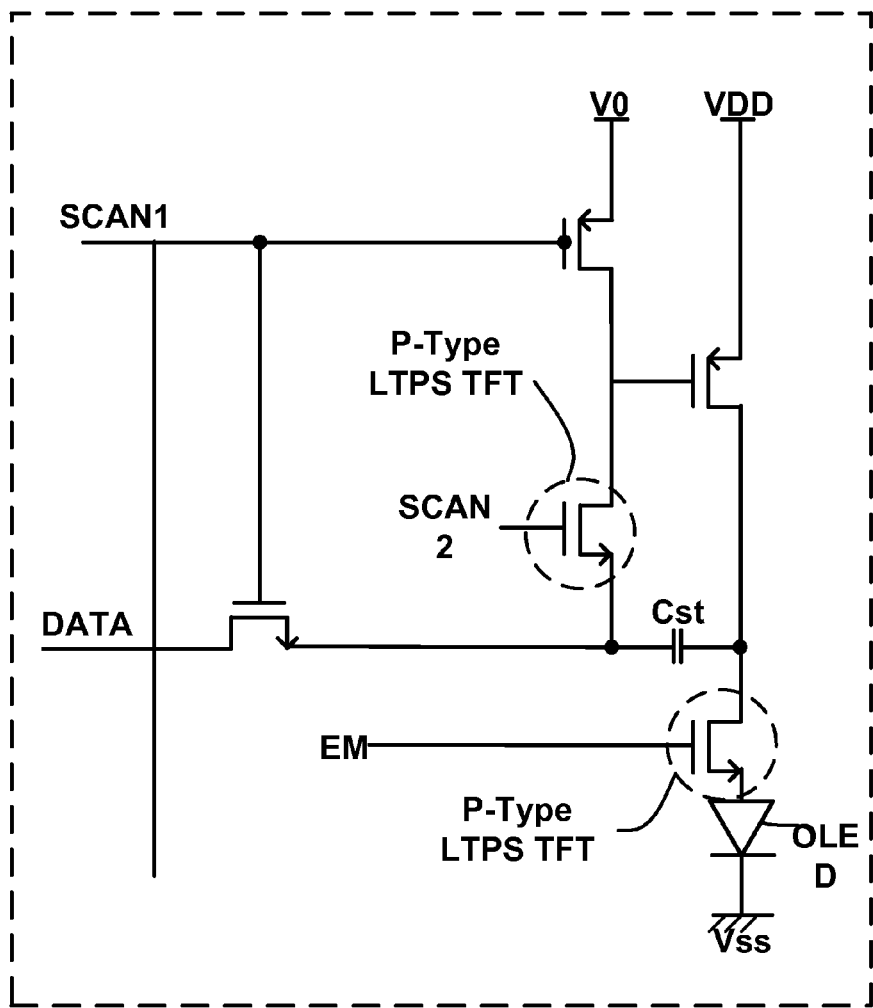
FIG. 3B illustrates the same 5T1C pixel circuit, but implemented with a combination of N-Type oxide TFTs and P-Type LTPS TFTs, and the timing diagram describing the operation of the pixel circuit.
Figure 3B:
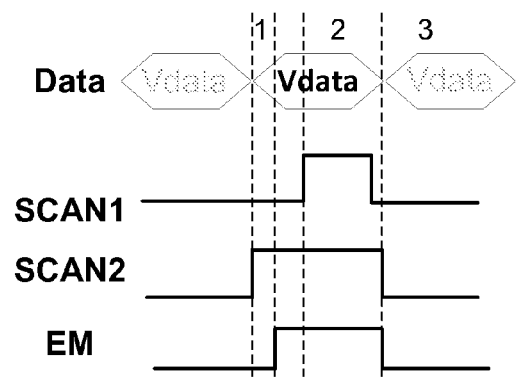

FIG. 3A illustrates an exemplary 5T1C pixel circuit implemented with N-Type oxide TFTs and the timing diagram describing the operation of the pixel circuit. FIG. 3B illustrates the same 5T1C pixel circuit, but implemented with a combination of N-Type oxide TFTs and P-Type LTPS TFTs, and the timing diagram describing the operation of the pixel circuit.

As shown in FIG. 3A, the switching transistors having their gate electrode connected to the second scan line (Scan2) and the emission signal line (EM) are configured to receive current for longer period of time during the operation. As discussed above, those switching transistors are likely to be affected by the positive bias stress, which may lead to non-uniformity in the display. Accordingly, those transistors in the pixel circuit operating under the higher stress condition (e.g., turned on for a longer period of time) can be formed with P-Type LTPS TFT instead of the N-Type LTPS TFT, which may be affected less by the positive bias stress. Referring to FIG. 3B, the transistor controlled by the second scan line (Scan2) and the emission signal line (EM) can be formed of a P-Type LTPS TFT. In this setting, the operation of the pixel circuit may change as shown in the timing diagram of FIG. 3B.

Employing a combination of P-Type LTPS TFTs and N-Type oxide TFTs in the pixel circuit may eliminate a need for providing an invert circuit in the driving circuit of the backplane. Elimination of the invert circuit from the driving circuit means elimination of clock signals associated in controlling the invert circuit. The power consumption of the display can be reduced with a reduced number of clock signals. Also, a typical invert circuit is implemented with several TFTs (e.g., 5-8), which may add up to a considerable number of TFTs in the entire driving circuit. Accordingly, eliminating the invert circuit along with the associated clock signal lines from the backplane can save a considerable space from the non-display area of the display, which allows to for a narrower bezel in the display.

In cases where a CMOS circuit or an inverter circuit is provided in the backplane, it can be implemented with a combination of an LTPS TFT and an oxide TFT. For instance, a P-type LTPS TFT and an N-Type oxide TFT can be used to implement a CMOS circuit in the driving circuit and/or the pixel circuit. Accordingly, where an invert circuit is needed, the invert circuit can be simplified by using a combination of N-Type oxide TFT and P-Type LTPS TFT. In this setting, the number of TFTs required to implement an invert circuit can be significantly reduced (e.g., 2) when it is implemented with a combination of N-Type oxide TFT and P-Type LTPS TFT.

In some embodiments, the array of pixel circuits may be implemented with oxide TFTs, while the driving circuits implemented on the backplane may be implemented with a combination of N-Type LTPS TFTs and P-Type LTPS TFTs. For instance, N-Type LTPS TFTs and P-Type LTPS TFTs can be used to implement a CMOS circuit (e.g., CMOS invert circuit) in the GIP, whereas oxide TFTs are employed in at least some part of the pixel circuits. Unlike the GIP formed entirely of either the P-type or N-type LTPS TFTs, the gate out signal from the GIP with a CMOS circuit can be controlled by DC signals or logic high/low signals. This allows for more stable control of the gate line during the blank period to suppress current leakage from the pixel circuit to the GIP or to suppress unintended activation of the pixels connected the gate line.

For each TFT added in a pixel circuit, an additional gate line needs to be routed within the limited space allocated for each pixel in the display. This may complicate the manufacturing of the display and limit the maximum resolution of the display that can be achieved in a fixed dimension. The issue is more serious for OLED displays, as the OLED pixel circuit generally requires more TFTs than the pixel circuit for a LCD pixel. In case of a bottom emission type OLED display, the space taken up by the gate line routed within the pixel has a direct impact in the aperture ratio of the pixel. Accordingly, in some embodiments of the present disclosure, pixel circuits can be implemented with a combination of oxide TFTs and LTPS TFTs to reduce the number of gate lines.

For instance, a pixel circuit may be supplied with a number of signal lines for controlling the TFTs in a pixel circuit. The first signal line may be configured to supply a high level signal (VGH) to the pixel circuit when a second signal line supplies a low level signal (VGL). In such cases, one or more TFTs controlled by the first signal line may be formed of one of an N-Type oxide TFT and a P-Type LTPS TFT, and one or more TFTs controlled by the second signal line may be formed of another one of an N-Type oxide TFT and a P-Type LTPS TFT. In this setting, a single signal line can be provided to those TFTs, which were controlled by the first and the second signal lines.

To put it in other way, any pair of TFTs in a pixel circuit, which are configured to receive signals of the opposite level from each other, may be formed of a combination of an N-Type oxide TFT and a P-Type LTPS TFT. More specifically, a first TFT in a pixel circuit may be configured to receive a high level signal (VGH) while a low level signal (VGL) is supplied to a second TFT in the same pixel circuit. In such cases, one of the TFTs can be formed of an N-Type oxide TFT while the other TFT can be formed of a P-Type LTPS TFT, and the gates of these two TFTs can be connected to the same signal line. In this setting, the high level signal (VGH) on the signal line activates one TFT while the low level signal (VGL) activates another TFT of the pixel circuit.

Figure 4:
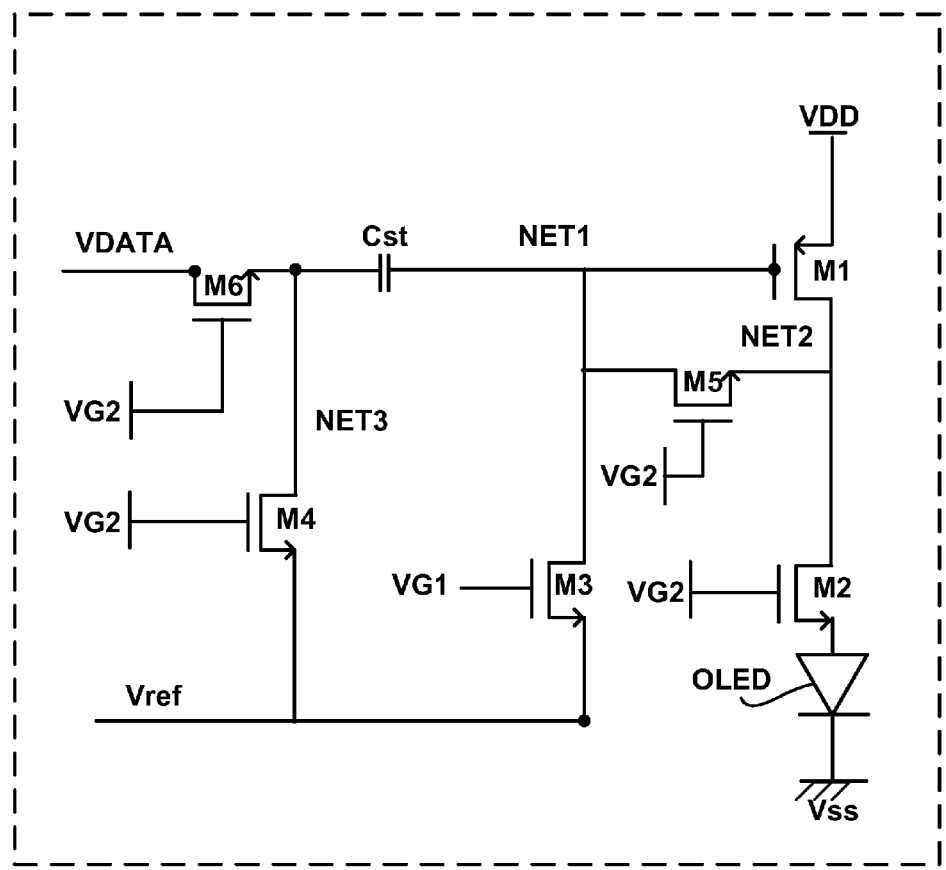
FIG. 4 illustrates an exemplary pixel circuit provided with a combination of N-Type oxide TFTs and P-Type LTPS TFTs, which are configured to share a gate signal line.

FIG. 4 illustrates an exemplary pixel circuit provided with a combination of N-Type oxide TFTs and P-Type LTPS TFTs, which are configured to share a gate signal line.

The pixel circuit shown in FIG. 4 includes six transistors (denoted M1 through M6) and a storage capacitor (Cst). For this pixel circuit, two different signal lines (i.e., VG1, VG2) are used to control the TFTs of the pixel circuit. The first TFT (M1) is a driving TFT in the pixel circuit. The first TFT (M1) has an electrode connected to the driving voltage line (VDD) and another electrode connected to a node (NET2). The second transistor (M2) has an electrode connected to the anode of the OLED element and another electrode connected to the node (NET2) between the first TFT (M1). The third transistor (M3) has an electrode connected to a reference voltage line (Vref) and configured to supply the reference voltage to the node (NET1), which is connected to the gate of the driving TFT (M1). The fourth TFT (M4) has an electrode connected to the reference voltage line (Vref) and another electrode connected to the node (NET3), which is connected to the storage capacitor (C1). The fifth TFT (M5) has an electrode connected to the node (NET2) between the driving TFT (M1) and the emission TFT (M2). The sixth transistor (M6) has an electrode connected to the data signal line of the display, and transmits the data signal from the data signal line in response to the signal from the gate line.

In particular, the gate of a third TFT (M3) is connected to the first signal line (VG1) and the gates of the second TFT (M2), the fourth TFT (M4), the fifth TFT (M5) and the sixth TFT (M6) are connected to the second signal line (VG2). In this circuit configuration, the second TFT (M2) and the fourth TFT (M4) are configured to be activated in the opposite timing from the fifth TFT (M5) and the sixth TFT (M6).

Accordingly, in one suitable embodiment, the second TFT (M2) and the fourth TFT (M4) can be formed of the N-Type oxide TFT, and the fifth TFT (M5) and the sixth TFT (M6) can be formed of the P-Type LTPS TFT. In an alternate embodiment, the second TFT (M2) and the fourth TFT (M4) can be formed of P-Type LTPS TFT, and the fifth TFT (M5) and the sixth TFT (M6) can be formed of N-Type oxide TFT. Since the second TFT (M2) and the fourth TFT (M4) need to be activated at the opposite timing from that of the fifth TFT (M5) and the sixth TFT (M6), the second TFT (M2) and the fourth TFT (M4) can be formed of P-Type oxide TFT while the fifth TFT (M5) and the sixth TFT (M6) are formed of N-Type LTPS TFT. In yet another embodiment, the second TFT (M2) and the fourth TFT (M4) can be formed of N-Type LTPS TFT while the fifth TFT (M5) and the sixth TFT (M6) are formed of P-Type oxide TFT.

The use of multiple types of TFTs on the same substrate needs not be confined to a stage level of a GIP or to a single pixel circuit. That is at least one of the TFTs in one stage of a shift register of a GIP may be formed of an oxide TFT while one of the TFTs in another stage of the shift register is formed of an LTPS TFT. Similarly, one of the TFTs in a pixel circuit may be formed of an oxide TFT while one of the TFTs in another pixel circuit may be formed of an LTPS TFT.

Figure 5:
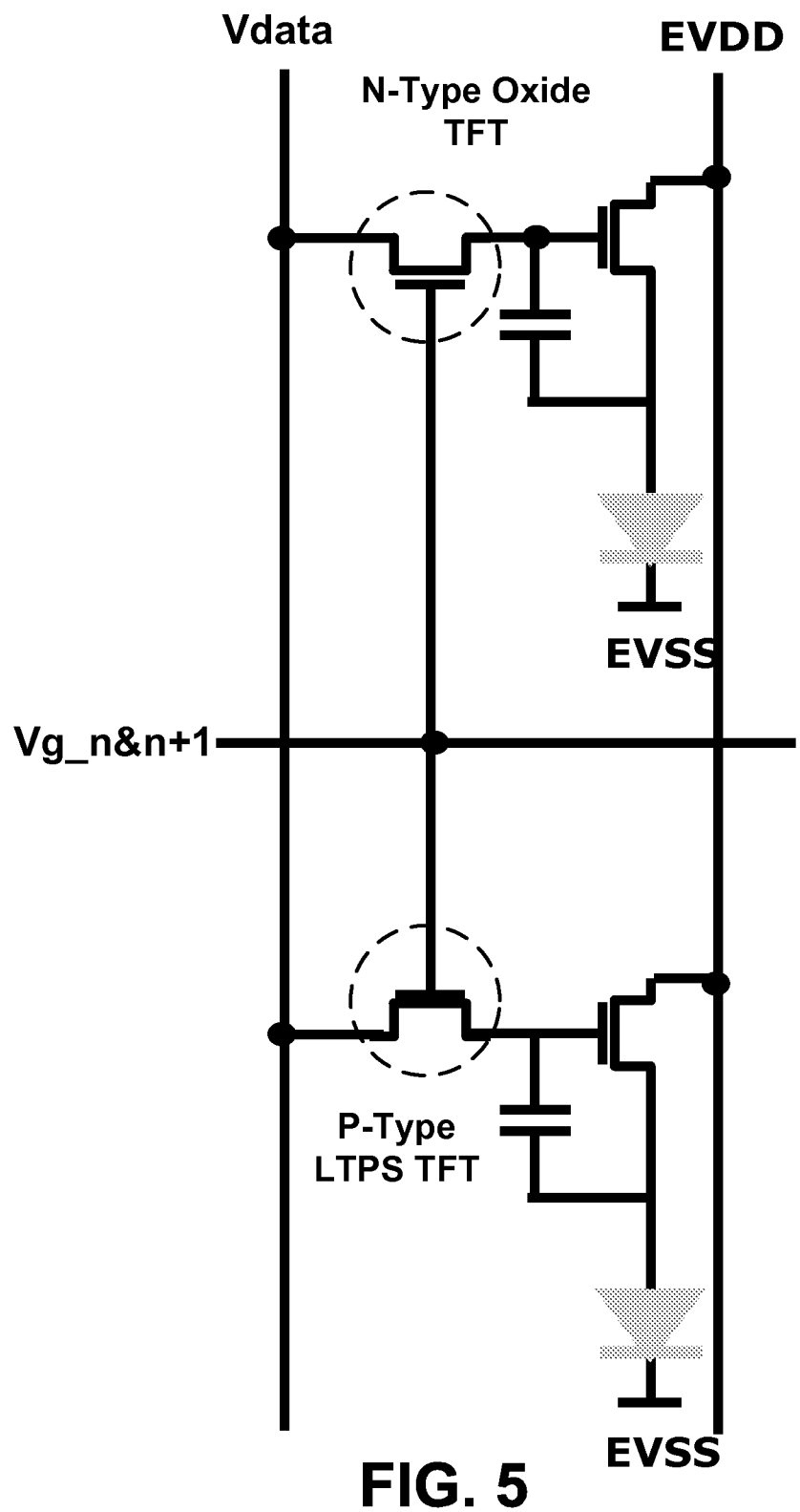
FIG. 5 illustrates an exemplary configuration of two pixel circuits, in which one of the pixel circuit is provided with an N-Type oxide TFT and the other pixel circuit is provided with a P-Type LTPS TFT.

FIG. 5 illustrates an exemplary configuration of two pixel circuits, in which one of the pixel circuit is provided with an N-Type oxide TFT and the other pixel circuit is provided with a P-Type LTPS TFT. As shown in FIG. 5, the first pixel circuit includes a switching TFT formed of N-Type oxide TFT, and the corresponding TFT in the second pixel circuit is formed of a P-Type LTPS TFT. The first pixel circuit may be associated with a pixel of an odd line of the display, whereas the second pixel circuit may be associated with a pixel of an even line of the display. In this setting, the gate of the N-Type oxide TFT of the first pixel circuit and the gate of the P-Type LTPS TFT of the second pixel circuit may be connected to a single gate line. In this way, the number of gate lines can be reduced in the display.

The TFTs in each of the pixel circuit that shares the gate line may be the TFT configured to provide the data signal in response to the gate signal on the shared gate line. In one illustrative example, signals for controlling the pixel circuit may be set as follow: a data signal (VDATA) between 0 and 5V, a VGL of −10V, a VGO of 3V, a VGH of 15V, a VREF of 1V. In this setting, the threshold voltage of the N-Type oxide TFT in the first pixel circuit and the P-Type LTPS TFT in the second pixel circuit may be set to 3V and −2.5V, respectively.

The driving TFT connected to the OLED element in the first and second pixel circuits are not particularly limited, and they can be formed with any one of N-Type oxide TFT and P-Type LTPS TFT. If desired, the driving TFTs in the first pixel circuit and the second pixel circuit may be formed of different type of TFT from each other.

It should be appreciated that the N-Type oxide TFT in the first pixel circuit and the P-Type LTPS TFT in the second pixel circuit are not limited to the TFT connected to the data signal line. Depending on the design of the pixel circuit and the driving scheme, other switching TFTs, for instance a TFT connected to a reference signal line in the two pixel circuits, may be configured with different kinds of TFT from each other. The use of N-Type oxide TFT and P-Type LTPS TFT in the adjacent pixel circuits allows reduction in the number of gate line at the border of the two adjacent pixels, which may be particularly advantageous in a transparent display. In a transparent display, which is provided with pixels divided in a emissive region (i.e., the region with the pixel circuit) and a transparent region, the emissive region of the two adjacent pixels (e.g., an odd line pixel and an even line pixel) can be positioned next to the shared gate line. This configuration would make the transparent regions of the pixel to be positioned next to each other, which may improve the transparency of the display.

Providing multiple types of TFTs on the same substrate as described in the present disclosure can be a challenging process. Some of the processes related in forming one type of TFT may damage or otherwise degrade the other type of TFT on the same backplane. For instance annealing process for forming poly-crystalized semiconductor layer may damage the metal oxide semiconductor layer. As such, it may be desirable to perform the annealing process in fabricating an LTPS TFT on the backplane prior to providing the metal oxide layer, which is to serve as the active layer of the oxide TFT. Further, fabricating a backplane with multiple types of TFTs may increase the number of masks, which in turn, lowers the yield and increases the manufacturing cost of the display.

Figure 6A:
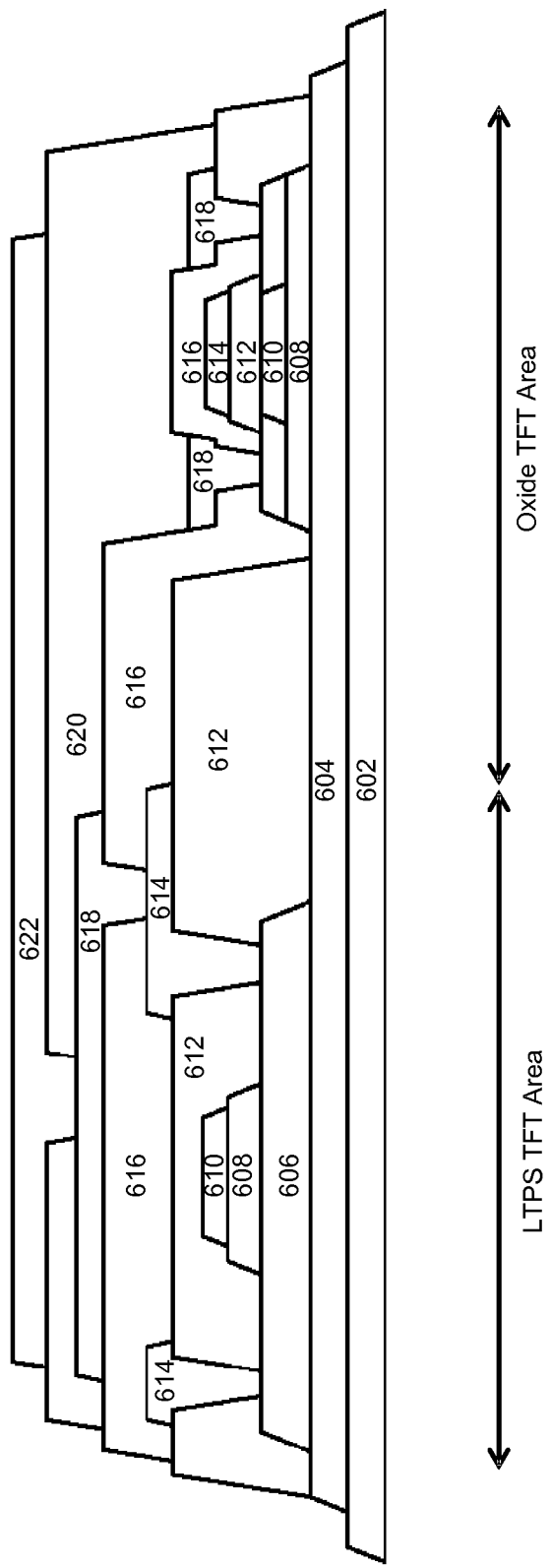
FIG. 6A is a cross-sectional view of an exemplary backplane implemented with multiple types of TFTs, according to an embodiment of the present disclosure.

FIG. 6A is a cross-sectional view of an exemplary backplane implemented with multiple types of TFTs, according to an embodiment of the present disclosure.

When the backplane of the flexible display is implemented with multiple kinds of semiconductor materials including the oxide semiconductor, the metal oxide semiconductor layer can be patterned and selectively turned into electrodes of the LTPS TFT. More specifically, the layer of metal oxide semiconductor can be patterned as the active layer of the oxide TFT as well as one or more electrodes for the LTPS TFT. Post treatments, such as plasma treatment for increasing the carrier concentration or other implantation and/or thermal annealing processes, can be performed on some part of the patterned oxide semiconductor layer to turn the treated parts to serve as S/D regions between a channel region of the oxide TFT. The same process can be performed on the metal oxide layer patterned in place of one or more electrodes of the LTPS TFT so that it can serve as the electrode of the LTPS TFT.

Using the metal oxide layer for forming the active layer of the oxide TFT as one or more electrodes in the LTPS TFT allows reduction in the number of masks needed in fabricating the backplane with multiple types of TFTs. Also, some of the insulation layers used in forming the LTPS TFT on the backplane can also serve as the insulation layer for the oxide TFT, albeit the specific function of the insulation layer may differ in the TFT. Utilizing an insulation layer of one type of TFT for an insulation layer of another type of TFT can also help in reducing the number of masks and simplifying the manufacturing process of the backplane.

Figure 6B:
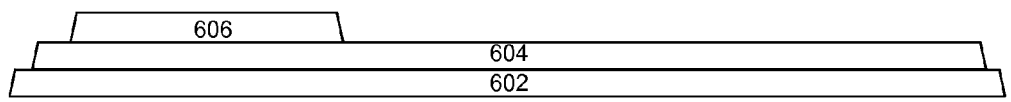
FIGS. 6B-6H are cross-sectional views showing the configuration of the oxide TFT and the LTPS TFT during fabricating them on the backplane in the configuration depicted in FIG. 6A.

FIG. 6B is a cross-sectional view showing the configuration of the oxide TFT and the LTPS TFT during fabricating them on the backplane in the configuration depicted in FIG. 6A. Referring to FIG. 6B, a buffer layer 604 is formed on the substrate 602. In the area for forming the LTPS TFT (denoted as the "LTPS TFT region"), a poly-silicon active layer 606 is formed on the buffer layer 604. Fabricating the poly-silicon active layer 606 of the LTPS TFT as shown in FIG. 6B would require a first mask (for poly-silicon active layer patterning). As mentioned, the laser annealing or other suitable processes for turning the amorphous silicon layer into the poly-silicon active layer 606 can be performed prior to the deposition of the metal oxide layer on the backplane.

Figure 6C:
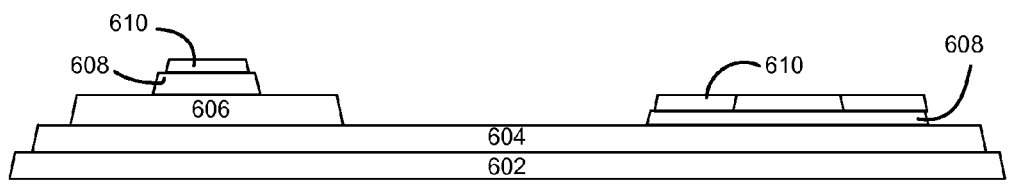

Referring to FIG. 6C, a first insulation layer 608 is provided on the poly-silicon active layer 606 to serve as a gate insulation layer (GI_L). If desired, the first insulation layer 608 can be provided in the area for forming the oxide TFT (denoted as the "oxide TFT region") to serve as an extra buffer layer under the active layer of the oxide TFT. Then a metal oxide layer 610 is provided in the oxide TFT region, which would serve as the active layer of the oxide TFT. Instead of providing a discrete conductive layer for the gate of the LTPS TFT, the metal oxide layer 610 is patterned on the gate insulation layer 608 in the LTPS TFT region. In other words, the metal oxide layer 610 is used as a gate electrode of the LTPS TFT and also as an active layer of the oxide TFT.

As briefly discussed above, one or more post-processes (e.g., plasma treatment, doping, implantation, annealing, etc.) can be performed to increase the conductivity at selective parts of the metal oxide layer 610. In particular, the post-process can be performed to increase the conductivity at the S/D regions of the metal oxide layer 610 at the oxide TFT region. The post-process, which forms the S/D regions in the metal oxide layer 610 of the oxide TFT, also increases the conductivity of the metal oxide layer 610 patterned on the gate insulation layer 608 at the LTPS TFT region. With the increased conductivity, the metal oxide layer 610 at the LTPS TFT region can effectively serve as a gate electrode of the LTPS TFT. It should be appreciated that the use of the metal oxide layer 610 to form the gate electrode of the LTPS TFT reduces a mask required in fabricating the backplane with the multiple types of TFTs.

In this regard, a layer of photo-resist (PR) can be provided over the metal oxide layer in the LTPS TFT region and the oxide TFT region, then selective parts of the PR layer is exposed through a second mask. Here, a half-tone mask (HTM) process can be used so that the PR layer over the channel region of the oxide TFT region is left with a higher thickness than the PR layer over other parts of the metal oxide layer 610. That is, the PR layer over the channel region in the active layer of the oxide TFT can be left with a greater thickness than the PR layer over the S/D regions in the active layer of the oxide TFT. Also, the PR layer over the channel region in the active layer of the oxide TFT can be left with a greater thickness than the PR layer over the metal oxide layer 610 in the LTPS TFT region, which is to serve as the gate electrode of the LTPS TFT. The extra thickness of the PR layer over the channel region of the oxide TFT allows maintaining of the semiconductor property even after the processes for increasing the conductivity of the metal oxide layer 610 at the LTPS TFT region to turn it into the gate electrode.

Figure 6D:
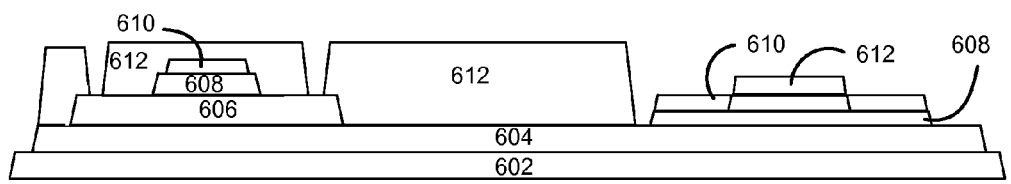

Referring to FIG. 6D, a second insulation layer 612 is provided over the LTPS TFT region and the oxide TFT region. Here, a third mask can be used to pattern the second insulation layer 612 so that it serves as the interlayer dielectric layer (ILD) at the LTPS TFT region and also as the gate insulation layer (GI_O) in the oxide TFT region. In this regard, a half-tone mask process can be used to control the thicknesses of the second insulation layer 612 at the selective regions. More specifically, the second insulation layer 612 can be formed in a first thickness, which is suitable to serve as the ILD in the LTPS TFT region. The second insulation layer 612 can be formed in a second thickness, which is suitable to serve as the gate insulation layer (GI_O) in the oxide TFT region. For instance, the thickness of the second insulation layer 612 may have a thickness of about 4000 Å in the LTPS TFT region and may have a thickness of about 2000 Å in the oxide TFT region. As shown in FIG. 6D, contact holes can be provided with contact holes, which expose the S/D regions of the poly-silicon active layer 606.

Figure 6E:
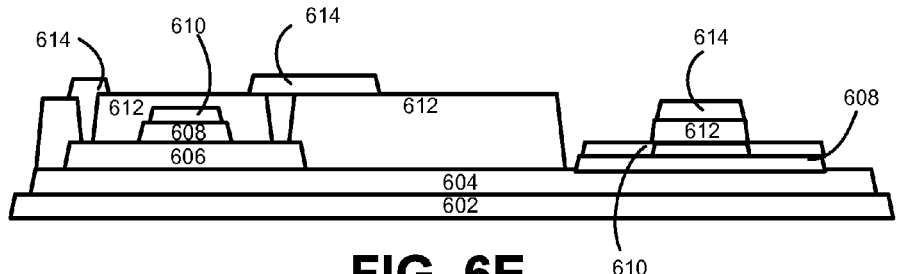

Referring to FIG. 6E, a first metal layer 614 can be provided over the second insulation layer 612. A fourth mask is used to pattern the first metal layer 614. In the LTPS TFT region, the first metal layer 614 is patterned to form the S/D electrodes of the LTPS TFT. In the oxide TFT region, the first metal layer 614 is patterned to form a gate electrode of the oxide TFT.

Figure 6F:
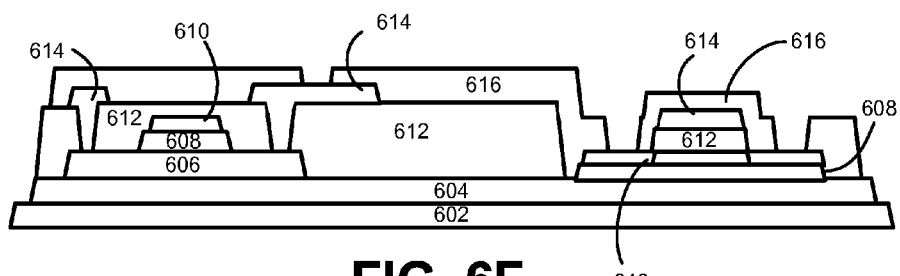

Referring to FIG. 6F, a third insulation layer 616 is provided over the LTPS TFT region and the oxide TFT region. Using a fifth mask, the third insulation layer 616 is patterned to serve as the passivation layer over the S/D electrodes of the LTPS TFT and to serve as the ILD for the oxide TFT. Since the third insulation 616 serves as the passivation layer over the S/D electrodes of the LTPS TFT, one or more contact holes through the third insulation layer 616 can be provided to expose some parts of the S/D electrodes of the LTPS TFT. The contact holes through the third insulation layer 616 can be used to connect a signal line and/or other electrodes to the S/D of the LTPS TFT.

Figure 6G:
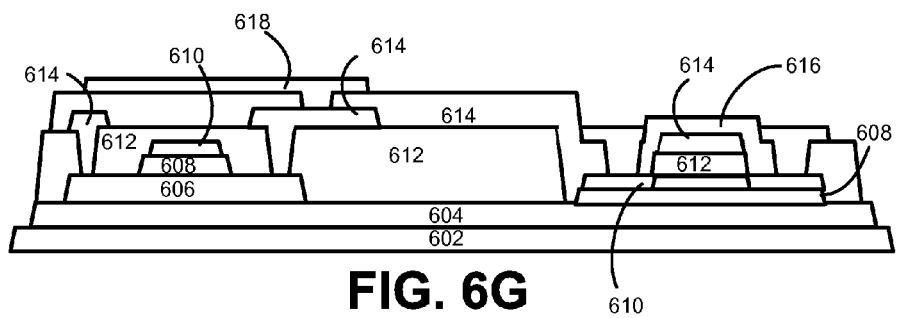

Referring to FIG. 6G, the second metal layer 618 is provided over the third insulation layer 616. Using a sixth mask, the second metal layer 618 can be patterned as a inter metal layer (INT) at the LTPS TFT region, which is connected to the S/D electrode of the LTPS TFT through the contact hole in the third insulation layer 616. Although the second metal layer 618 in the LTPS TFT region is described as the inter-metal layer in this particular embodiment, the functionality of the second metal layer 618 is not limited as such. Accordingly, the second metal layer 618 may serves as a signal line, an electrode and various other purposes in the backplane. In the oxide TFT region, the second metal layer 618 can be patterned to serve as the S/D electrodes of the oxide TFT.

Figure 6H:
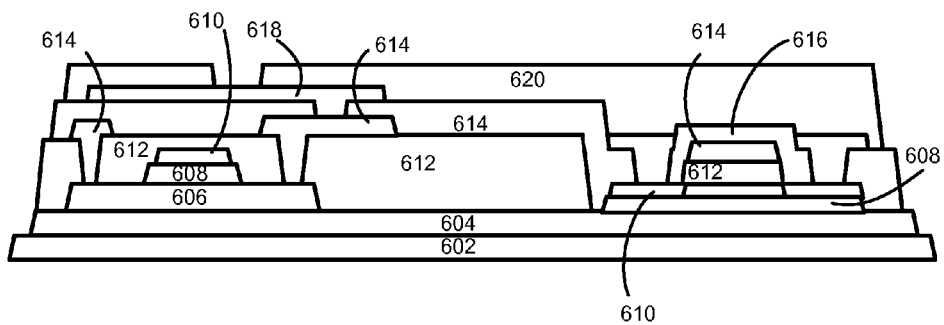

Referring to FIG. 6H, a fourth insulation layer 620 is provided over both the LTPS TFT and the oxide TFT. The fourth insulation layer 620 may be a planarization layer (PLN) for providing a planar surface over the LTPS TFT region and the oxide TFT region. Using a seventh mask, a contact hole may be provided through the fourth insulation layer 620 to expose a selective parts of the second metal layer 618. In FIG. 6H, the inter-metal layer (INT) is exposed through a contact hole of the fourth insulation layer 620. While the fourth insulation layer 620 serves as the planarization layer (PLN) over both the LTPS TFT and the oxide TFT, it also serves as a passivation layer over the S/D electrodes of the oxide TFT. Accordingly, in some embodiments, the fourth insulation layer 620 may be provided with one or more contact holes for exposing the S/D electrodes of the oxide TFT.

Referring to FIG. 6A, a third metal layer 622 can be patterned in the desired region over the fourth insulation layer 620 by using an eighth mask. The third metal layer 622 can be in contact with the second metal layer 618 through the fourth insulation layer 620. For instance, the third metal layer 622 may be in contact with the inter-metal layer (INT) as shown in FIG. 6A. In some other embodiments, the third metal layer 622 patterned over the fourth insulation layer 620 can be in contact with the S/D electrode of the oxide TFT.

It should be appreciated that the LTPS TFT and the oxide TFT shown in FIG. 6A can be configured to serve various purposes in the backplane. Any combined use of the oxide TFT and the LTPS TFT described in the present disclosure may be achieved with the configuration of the oxide TFT and the LTPS TFT shown in FIG. 6A. The LTPS TFT shown in FIG. 6A may be a TFT included in a driving circuit, while the oxide TFT may be a TFT included in a pixel circuit. The LTPS TFT shown in FIG. 6A may be a TFT included in a pixel circuit, while the oxide TFT may be a TFT included in a driving circuit. Both of the LTPS TFT and the oxide TFT shown in FIG. 6A may the TFTs included in single pixel circuit or in multiple pixel circuits. Also, both of the LTPS TFT and the oxide TFT shown in FIG. 6A may the TFTs included in single pixel circuit or in multiple pixel circuits.

Accordingly, the functionality of the third metal layer 622 in the backplane may vary depending on the location of the third metal layer 622 within the backplane as well as the location and the function of the TFT connected to the third metal layer 622. By way of an example, the LTPS TFT shown in FIG. 6A may be a driving TFT in a pixel circuit, and the third metal layer 622 may serve as an anode of an OLED element. In some cases, the LTPS TFT shown in FIG. 6A may be a switching TFT in a pixel circuit, and the third metal layer 622 may be a signal line transmitting a signal from a driving circuit. In some cases, the LTPS TFT may be one of the TFTs implementing a driving circuit provided in the non-display area of the display, and the third metal layer 622 may serve as a signal line for transmitting a signal from the respective driving circuit. As mentioned above, instead of the LTPS TFT, the third metal layer 622 may be in contact with the S/D electrodes of the oxide TFT, and provides a function associated with the respective oxide TFT.

In the configuration of FIG. 6A, the gate of the LTPS TFT is formed with the layer of metal oxide, which forms the semiconductor layer of the oxide TFT. Also, several insulation layers provided in the backplane serve as one purpose in the LTPS TFT region and another purpose in the oxide TFT region. This can provide more efficient way of manufacturing the backplane with multiple types of TFTs.

Figure 7A:
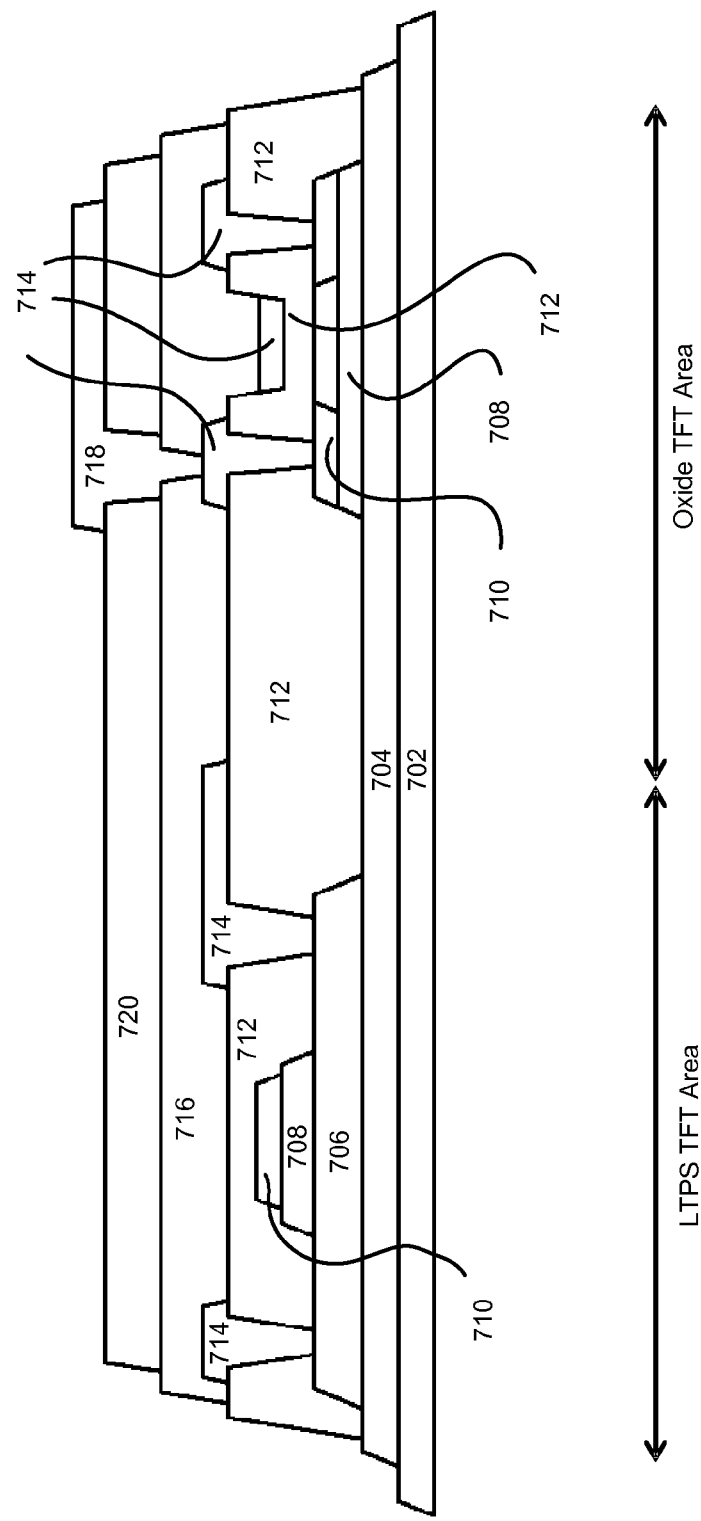
FIG. 7A is a cross-sectional view of an exemplary backplane implemented with multiple types of TFTs, according to an embodiment of the present disclosure.
Figure 7B:
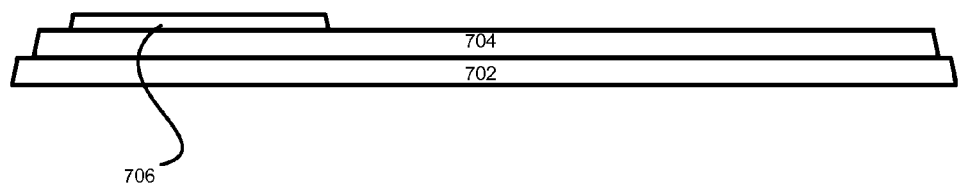
FIGS. 7B-7G are cross-sectional views showing the configuration of the oxide TFT and the LTPS TFT during fabricating them on the backplane in the configuration depicted in FIG. 7A.

FIG. 7A illustrates another exemplary configuration of an oxide TFT and an LTPS TFT of a backplane, according to an embodiment of the present disclosure. FIG. 7B is a cross-sectional view showing the configuration of the oxide TFT and the LTPS TFT during fabricating them on the backplane in the configuration depicted in FIG. 7A.

Figure 7C:
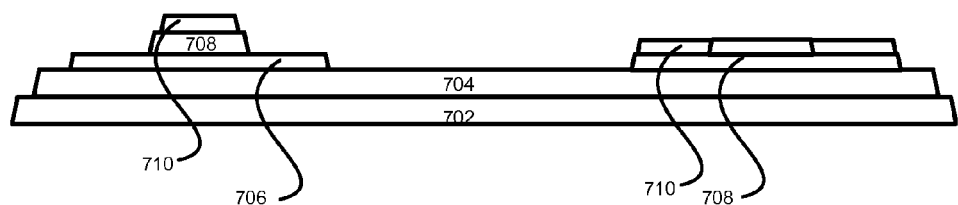

Referring to FIGS. 7B and 7C, the configuration of the buffer layer 704 and the poly-silicon active layer 706 on the substrate 702 is the same as the configuration described in reference with FIG. 6B. Accordingly, forming the gate electrode of the LTPS TFT with the metal oxide layer 710 requires two masks.

Figure 7D:
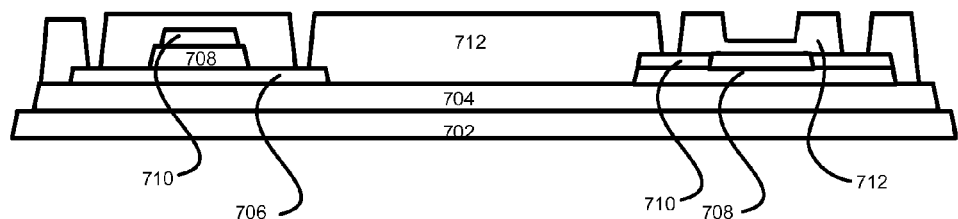

Further reduction in the number of masks necessary is realized by the configuration depicted in FIG. 7D. It should be noted that, the interlayer dielectric layers (ILD) for the LTPS TFT and the oxide TFT were formed by different insulation layers in the configuration of FIG. 6A. That is, the interlayer dielectric layers (ILD) for the LTPS TFT was formed with the second insulation layer 612 whereas the interlayer dielectric layers (ILD) for the oxide TFT was formed with the third insulation layer 616.

However, in the configuration shown in FIG. 7D, the same insulation layer is used to serve as the interlayer dielectric layer (ILD) for both the LTPS TFT and the oxide TFT. More specifically, the second insulation layer 712 that serves the interlayer dielectric layers (ILD) for the LTPS TFT also serves as the interlayer dielectric layers (ILD) for the oxide TFT.

In addition, the second insulation layer 712 serves yet another purpose for the oxide TFT. In particular, the second insulation layer 712 is patterned with a third mask, so that it also serves as the gate insulation (GI_O) of the oxide TFT. Forming the gate insulation (GI_O) and the interlayer dielectric layers (ILD) for the oxide TFT along with the interlayer dielectric layer (ILD) for the LTPS TFT eliminates a need for at least one mask during the fabrication process of providing multiple types of TFTs in the backplane.

It should be noted that a thickness of the interlayer dielectric layer (ILD) suitable for the LTPS TFT may be different from the thickness of the interlayer dielectric layer (ILD) suitable for the oxide TFT. Further, the thickness of the gate insulation layer (GI_O) generally differs from the thickness of the interlayer dielectric layer (ILD). Accordingly, the second insulation layer 712 can be patterned using a half-tone mask (HTM) to control its thickness at different parts of the backplane. By way of example, in the LTPS TFT region, the second insulation layer 712 may be provided in a first thickness that is suitable to serve as the interlayer dielectric layer (ILD) for the LTPS TFT. In the oxide TFT region, parts of the second insulation 712 serving as the interlayer dielectric layer (ILD) can be provided in a second thickness while other parts serving as the gate insulation layer (GI_O) is provided in a third thickness.

In some cases, the first thickness and the second thickness for the second insulation layer 712 in the LTPS TFT region and the oxide TFT region may be the same. In one suitable embodiment, the second insulation layer 712 may be provided in a thickness of about 4000 Å where it serves as the interlayer dielectric layer (ILD), but provided in a thickness of about 2000 Å where it serves as the gate insulation (GI_O) of the oxide TFT.

Figure 7E:
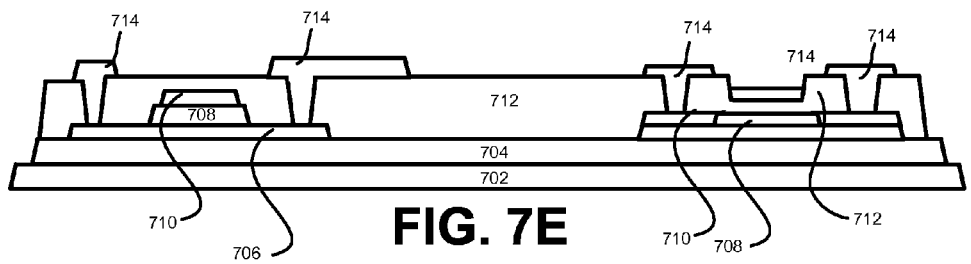

Referring to FIG. 7E, the first metal layer 714 is provided over the second insulation layer 712. With a fourth mask, the first metal layer 714 is patterned to provide S/D electrodes of the LTPS TFT as well as the gate electrode of the oxide TFT. Unlike the configuration of shown in FIG. 6A, the first metal layer 714 also forms the S/D electrodes of the oxide TFT as shown in FIG. 7E. In other words, all of the electrodes for the LTPS TFT and the oxide TFT, excluding the gate electrode of the LTPS TFT, are formed with the same metal layer (i.e., the first metal layer 714). At least one less mask is needed by forming the S/D electrodes of the oxide TFT and the LTPS TFT along with the gate electrode of the oxide TFT with a single metal layer.

Figure 7F:
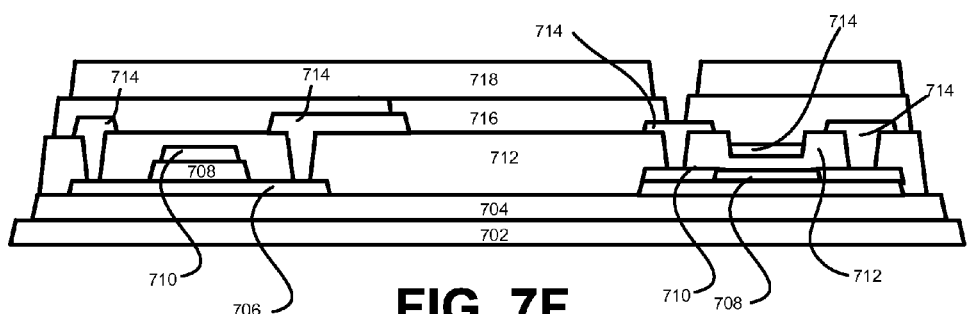

Referring to FIG. 7F, the third insulation layer 716 and the fourth insulation layer 720 is provided over the first metal layer 714. The third insulation layer 716 may serve as the passivation layer for the S/D electrodes of both the LTPS TFT and the oxide TFT. The fourth insulation layer 720 is provided over the third insulation layer 716. The fourth insulation layer 720 can serve as the planarization layer that provides a planar surface over the LTPS TFT and the oxide TFT.

It should be noted that, in the configuration shown in FIG. 6A, the third insulation 616 serves as a passivation layer for the LTPS TFT needs to serve as the interlayer dielectric layer (ILD) for the oxide TFT. Therefore, contact holes for S/D electrodes must be created before providing the fourth insulation layer 620 over the third insulation layer 616, then a separate process is required to create another contact hole(s) through the fourth insulation layer 620.

In the embodiments configured as shown in FIG. 7A, however, each of the third insulation layer 716 and the fourth insulation layer 720 serves the same function for the LTPS TFT and the oxide TFT. Especially, the third insulation layer 716 serves as the passivation layer for both the LTPS TFT and the oxide TFT, and therefore there is no need for patterning the third insulation layer 716 prior to providing the fourth insulation layer 720. Instead, contact hole(s) for S/D electrode contact can be created with a single mask after providing the third insulation layer 716 and the fourth insulation layer 720.

Figure 7G:
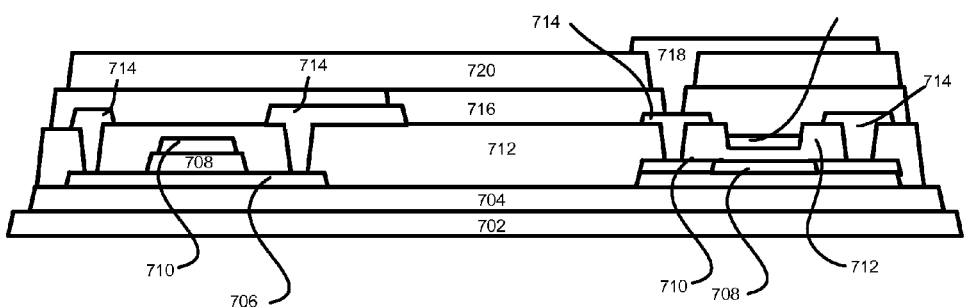

Referring to FIG. 7G, a second metal layer 718 is provided over the fourth insulation layer 716 to be in contact with the S/D electrode of one of the TFTs. In FIG. 7G, the second metal layer 718 is shown as being in contact with the S/D electrode of the oxide TFT through a contact hole provided in the third and fourth insulation layers. However, this is merely illustrative. If desired, a contact hole may be provided in the third and fourth insulation layers so that the second metal layer 718 can be in contact with the S/D electrode of the LTPS TFT. As described above, the LTPS TFT and the oxide TFT may be used within the backplane for any of the exemplary configurations described in the present disclosure. Therefore, the functionality of the second metal layer 718 can vary depending on the use of the particular TFT which it is in contact with.

Figure 8:
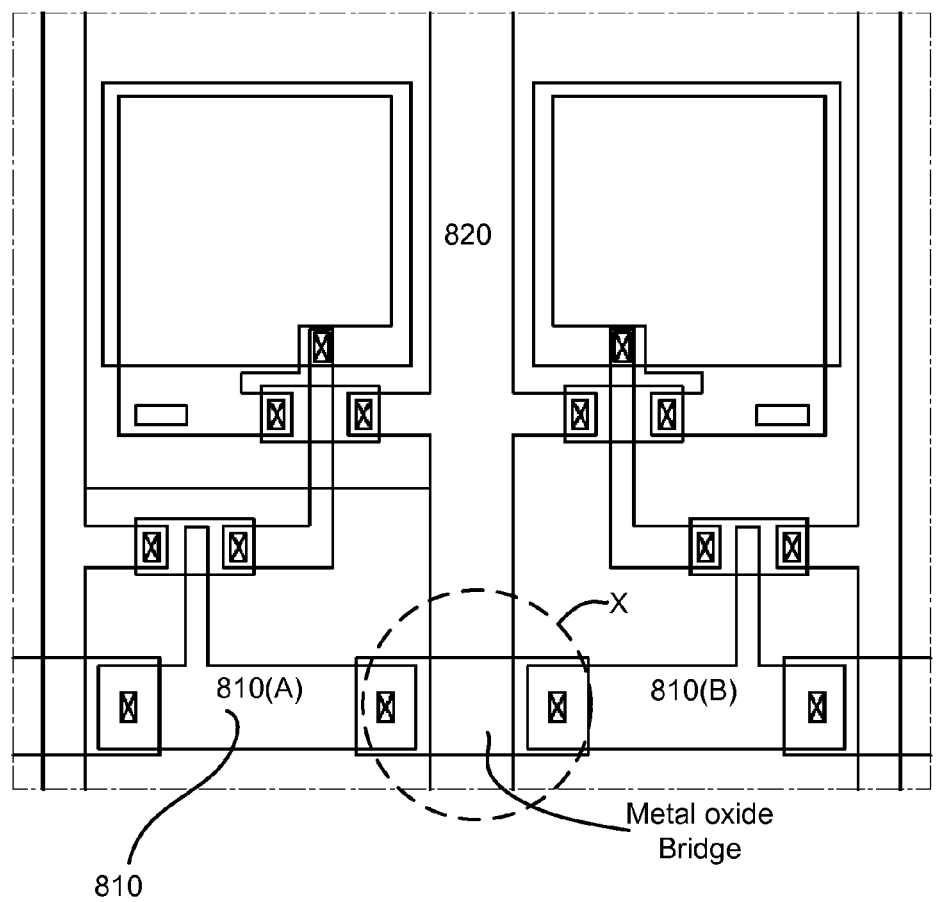
FIG. 8 is a plane view of an exemplary a pixel circuit configured with multiple types of TFTs (i.e., at least one LTPS TFT and at least one oxide TFT).

FIG. 8 is a plane view of an exemplary a pixel circuit configured with multiple types of TFTs (i.e., at least one LTPS TFT and at least one oxide TFT).

In the embodiments having the S/D electrodes and the gate electrode formed with a single metal layer, for instance the ones configured as in FIG. 7A, the gate line and the S/D line may cross each other. Of course, the gate line and the S/D line should not be in contact with each other. Accordingly, the metal oxide layer, which is used as the active layer oxide TFT, can also be used as a means for routing the lines across each other without creating a short.

Referring to FIG. 8, the first line 810 is arranged in a horizontal direction and the second line 820 is arranged in a vertical direction. The first line 810 is provided in multiple pieces (e.g., 810A, 810B) that are separated at the area denoted "X". Otherwise, the first line 810 would run across the second line 820, creating a short between the lines at the crossing area "X." Also, the metal oxide layer under the metal layer of the first and second lines (810, 820) is patterned so that it is provided at the crossing area "X." Conductivity of the metal oxide layer in the crossing area "X" can be increased in the similar way as the metal oxide layer configured as the gate electrode of the LTPS TFT. Contact holes can be provided through the insulation layer provided over the metal oxide layer so that the first piece 810A and the second piece 810B of the first line 810 contact the metal oxide layer thereunder. In this way, the metal oxide layer provided at the crossing area "X" can serve as a bridge for connecting the pieces of the first line (810A, 810B). Accordingly, the first line 810 and the second line 820 can be routed across each other even in the embodiments where the S/D and the gate electrodes of a TFT are provided with a single metal layer.

In the present disclosure, the metal oxide layer that serves as the active layer of the oxide TFT is described as composed of Indium-Gallium-Zinc-Oxide. However, this is merely illustrative. Various other compositions can be used for the metal oxide layer of the present disclosure. Examples of a constituent material of the metal oxide layer includes a quaternary metal oxide such as an indium-tin-gallium-zinc-oxide (In—Sn—Ga—Zn—O)-based material, a ternary metal oxide such as an indium-gallium-zinc-oxide (In—Ga—Zn—O)-based material, an indium-tin-zinc-oxide (In—Sn—Zn—O)-based material, an indium-aluminum-zinc-oxide (In—Al—Zn—O)-based material, an indium-hafnium-zinc-oxide (In—Hf—Zn—O)-based material, a tin-gallium-zinc-oxide (Sn—Ga—Zn—O)-based material, an aluminum-gallium-zinc-oxide (Al—Ga—Zn—O-based material) and a tin-aluminum-zinc-oxide (Sn—Al—Zn—O)-based material, and a binary metal oxide such as an indium-zinc-oxide (In—Zn—O)-based material, a tin-aluminum-zinc-oxide (Sn—Zn—O)-based material, an aluminum-zinc-oxide (Al—Zn—O)-based material, a zinc-magnesium-oxide (Zn—Mg—O)-based material, a tin-magnesium-oxide (Sn—Mg—O)-based material, an indium-magnesium-oxide (In—Mg—O)-based material, an indium-gallium-oxide (In—Ga—O)-based material, an indium-oxide (In—O)-based material, a tin-oxide (Sn—O)-based material and a zinc-oxide (Zn—O)-based material. Composition ratios of the elements included in the respective metal oxide layer are not particularly limited, and may be adjusted at various composition ratios.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims. While the low refresh rate driving mode and the TFT backplane suitable for such a driving mode have been described in the context of OLED display, it should be appreciated that the similar TFT backplane of the embodiments disclosed in the present disclosure can be used for a liquid crystal display (LCD) and various other types of displays.

What is claimed is:

1. A display, comprising:
   a substrate defined with a first area and a second area;
   a low-temperature-poly-silicon (LTPS) layer provided in the first area;
   a first insulation layer provided on the LTPS layer in the first area;
   a metal oxide layer provided in the first area and the second area, the metal oxide layer in the first area being provided on the first insulation layer;
   a second insulation layer provided in the first area and the second area, at least some portion of the second insulation layer on the metal oxide layer in the second area being thinner than other portions of the second insulation layer on the metal oxide layer in the second area;
   a plurality of contact holes exposing source/drain regions of the LTPS layer in the first area and source/drain regions of the metal oxide layer in the second area;
   a first metal layer providing a plurality of electrodes in the first area and the second area, the first metal layer in the first area including source/drain electrodes in contact with the exposed source/drain regions of the LTPS layer, and the first metal layer in the second area including source/drain electrodes in contact with the exposed source/drain regions of the metal oxide layer and a gate electrode insulated from the metal oxide layer by the thinner portion of the second insulation layer;
   a third insulation layer covering the first metal layer in the first area and the second area; and
   a second metal layer being in contact with at least one of the source/drain electrodes in the first area and the second area via a contact hole through the third insulation layer between the first metal layer and the second metal layer, wherein the LTPS layer in the first area serves as an active layer of an LTPS TFT and the metal oxide layer in the second area serves as an active layer of an oxide TFT,
   wherein the metal oxide layer in the first area and the source/drain regions of the metal oxide layer in the second area have higher electrical conductivity than the metal oxide layer in the second area that forms a channel region of the oxide TFT.

2. The display of claim 1, wherein the metal oxide layer in the first area serves as a gate electrode of the LTPS TFT.

3. The display of claim 1, wherein the second insulation layer serves as an interlayer dielectric layer of the LTPS TFT and the oxide TFT in the first area and the second area, respectively.

4. The display of claim 1, further comprising a fourth insulation layer in the first area and the second area interposed between the third insulation layer and the second metal layer, wherein the third insulation layer is a inorganic material based layer and the fourth insulation layer is an organic material based planarization layer.

5. The display of claim 1, wherein the second metal layer that is in contact with the first metal layer is an anode of an organic light-emitting element.

6. The display of claim 1, wherein the second metal layer that is in contact with the first metal layer is a conductive line transmitting between a pixel circuit and a driving circuit of a display.

7. A display, comprising:
   an array of thin-film-transistors (TFTs) including an oxide thin-film-transistor (TFT) and a low-temperature-poly-silicon (LTPS) TFT, wherein an insulation layer is configured to serve as an interlayer dielectric layer for both the LTPS TFT and the oxide TFT and as a gate insulation layer for the oxide TFT,
   wherein a gate electrode of the oxide TFT is formed of the same metal layer as that of source/drain electrodes of the oxide TFT.

8. The display of claim 7, wherein an active layer of the oxide TFT and a gate electrode of the LTPS TFT are formed of a metal oxide layer.

9. The display of claim 7, wherein source/drain electrodes of the LTPS TFT and the oxide TFT are formed of the same metal layer.

10. The display of claim 7, wherein the array of TFTs includes an array of pixel circuits, each pixel circuit associated with an organic light-emitting diode (OLED) element, and wherein an anode of the OLED element is connected to at least one of the source/drain electrodes of the oxide TFT and the LTPS TFT.

11. The display of claim 7, wherein the oxide TFT is provided in a display area of the display and the LTPS TFT is provided in a non-display area of the display.

12. The display of claim 7, further comprising:
    a pixel circuit associated with a display pixel in the display area; and
    a driving circuit in the non-display area configured to provide a plurality of signals to the pixel circuit, wherein the pixel circuit includes the oxide TFT and the driving circuit includes the LTPS TFT.

13. The display of claim 7, wherein the array of TFTs includes an array of pixel circuits associated with a plurality of display pixels in the display area, wherein the array of pixel circuits includes the oxide TFT and the LTPS TFT.

14. The display of claim 13, wherein one of the pixel circuit associated with a single display pixel includes the oxide TFT and the LTPS TFT.

15. The display of claim 7, further comprising a driving circuit in the non-display area configured to provide a plurality of signals to an array of pixel circuits associated with a plurality of display pixels in the display area, wherein the driving circuit in the non-display area includes said at least one oxide TFT and said at least one the LTPS TFT.

16. The display of claim 7, further comprising a gate line and a data line in a display area or a non-display area, wherein at least one of the gate line and the data line is provided in multiple pieces which are connected with a bridge formed of a metal oxide layer.

17. The display of claim 16, wherein the bridge is at a crossing area of the gate line and the data line.